United States Patent [19]

Sachdev et al.

[11] Patent Number: 5,781,025

[45] Date of Patent: Jul. 14, 1998

[54] METHOD FOR TESTING AN ELECTRONIC CIRCUIT BY LOGICALLY COMBINING CLOCK SIGNALS, AND AN ELECTRONIC CIRCUIT PROVIDED WITH FACILITIES FOR SUCH TESTING

[75] Inventors: Manoj Sachdev; Botjo Atzema, both of Eindhoven, Netherlands

[73] Assignee: U.S. Philips Corporation, New York, N.Y.

[21] Appl. No.: 674,523

[22] Filed: Jul. 2, 1996

[30] Foreign Application Priority Data

Jul. 6, 1995 [EP] European Pat. Off. .............. 95201853

[51] Int. Cl.[6] ........................................ G01R 25/00
[52] U.S. Cl. ...................... 326/16; 326/93; 326/96
[58] Field of Search .......................... 326/16, 93, 95, 326/96; 327/12, 18; 371/22.1

[56] References Cited

U.S. PATENT DOCUMENTS

| | | | |
|---|---|---|---|
| 4,542,509 | 9/1985 | Buchanan et al. | 371/61 |
| 4,812,678 | 3/1989 | Abe | 326/16 |
| 5,206,861 | 4/1993 | Hannon et al. | 371/22.3 |
| 5,406,132 | 4/1995 | Housako | 327/100 |
| 5,428,626 | 6/1995 | Frish et al. | 371/27 |
| 5,498,983 | 3/1996 | Schoellkopf | 327/7 |
| 5,519,714 | 5/1996 | Nakamura et al. | 371/22.3 |
| 5,606,564 | 2/1997 | Ho et al. | 326/16 |

OTHER PUBLICATIONS

Reyhani et al., "A 5V, 6-b, 80 Ms/s BiCMOS Flash ADC", IEEE Journal of Solid-State Circuits, vol. 29, No. 8, Aug. 1994, pp. 873–878.

Ruan, "A Behavioral Model of A/D Converters Using a Mixed-Mode Simulator", IEEE Journal of Solid-State Circuits, vol. 26, No. 3, Mar. 1991, pp. 283–290.

Primary Examiner—Tan T. Nguyen
Attorney, Agent, or Firm—Brian J. Wieghaus

[57] ABSTRACT

An electronic circuit has a plurality of nodes at which a plurality of clock signals are present in operational use. The clock signals should have a pre-determined timing relationship amongst themselves. The circuit includes logic circuitry having inputs connected to the nodes and having an output to provide a pulse train. Any discrepancy between the actual and ideal pulse trains indicates a fault.

6 Claims, 2 Drawing Sheets

METHOD FOR TESTING AN ELECTRONIC CIRCUIT BY LOGICALLY COMBINING CLOCK SIGNALS, AND AN ELECTRONIC CIRCUIT PROVIDED WITH FACILITIES FOR SUCH TESTING

FIELD OF THE INVENTION

The invention relates to an electronic circuit with a plurality of respective nodes at which a plurality of respective clock signals are present in operational use of the circuit. The invention also relates to a method of testing such a circuit. The clock signals have a common overall period, which may include the situation wherein certain clock signals have a frequency that is a multiple of a basic frequency. The shapes and relative time shifts of the various clock pulses are in principle arbitrary.

BACKGROUND ART

A plurality of clock signals are a typical example of signals that should relate to one another according to a predetermined interdependence in order to establish correct operation of a clocked circuit. Clock signals are usually binary, periodic signals. Clock signals are widely used in digital as well as in analog integrated circuits. In digital circuits such as microprocessors, often multiple clocks are utilized. In RAMs, a set of periodic internal signals are generated which control the internal timing. Similarly, in the analog domain (e.g., A/D and D/A converters), and in time-discrete circuits (e.g., switched capacitor circuits) clocks are widely used for sampling the data, voltages, and currents.

OBJECT OF THE INVENTION

Irrespective of the application domain of the clock signals, the fault-free operation of the IC depends on the timing relationship between different clock signals. However, clocks are in general not tested explicitly. For example, in the analog domain, most of the tests (e.g., signal to noise ratio) are targeted towards the reliability of the data path. Furthermore, most of the conventional test methods applied to electronic circuitry appear to focus on reliability of data paths, signal-to-noise ratio, differential non-linearity, integral non-linearity, bit error rate or code density measurement. In fact, there seems to be hardly any method which explicitly tests for proper clock signal interdependencies. Accordingly, there is a need for a testing scheme to analyze the timing relationships of such signals.

It is, inter alia, an object of the invention to provide a solution to the problem of how to test efficiently the timing integrity of the signals. It is another object to provide a circuit designed for testability with regard to correctness of the timing relationship among a plurality of signals.

SUMMARY OF THE INVENTION

To this end, the invention provides a circuit as specified in the preamble and characterized in that the circuit includes logic circuitry having inputs connected to the nodes and having an output to provide a pulse train for testing a pre-determined timing relationship amongst the clock signals.

Advantageously, the invention provides a large scale integrated electronic circuit, comprising digital circuitry elements and multiple clocked nodes interconnected to said circuitry elements for on said nodes receiving various different clock signals having a common overall clock period, characterized in that the electronic circuit contains internal test circuitry for testing a plurality of timing relationships between subsets of said clock signals, in that for each such subset logic function generating means have been provided that are fed by said nodes for, exclusively conditionally to a correct timing relationship among the subset in question, producing a predetermined logic pulse, and in that various such logic function generating means feed amalgamating circuitry, for in said amalgamating circuitry producing, exclusively conditionally to correct timing relationships among all subsets so combined, a predetermined periodic logic pulse train. A logic pulse is understood to mean a logic signal that observes a non-uniform logic value with time. Amalgamating of such logic pulses will over a time that compares to the period of the above basic frequency observe a behaviour that should in principle be periodic as well. Persisting or non-persisting deviations from an intended shape thereof can be detected in an easy manner.

The invention logically combines the plurality of clock signals to create a pulse train whose temporal characteristics reflect the timing relationship among the clock signals. The temporal features of the pulse train under error free conditions, e.g., the widths and locations of the pulses in the time domain, can easily be calculated. Any fault in the source of the clock signals or occurring along the signal paths introduces an observable deviation from the calculated pulse train. For example, the number of pulses in a certain time interval or the position of the pulses can be taken as the quantity to be monitored during testing.

The circuit may include a clock signal generator or the circuit may be one that receives the clock signals. The nodes may include clock signal inputs and/or clock signal outputs. Several nodes may be spaced apart along the same clock signal path. For example, the propagation delay inflicted upon a clock signal propagating from one node to another node can be measured by examining the associated edges in the pulse train.

The invention provides a generic solution to test clock signals in analog circuits (e.g., A/D converters and D/A converters) and digital circuits (e.g., microprocessors, memories). Through this technique, the temporal relationship between the clock signals can be monitored at a plurality of locations throughout the chip. In some situations, the pulse train is generated at the physical location where the clock timing relationship is most critical or most difficult to test. Through this technique also a comparison of best case and worse case timing is carried out.

Since the pulse train carries information about the timing of the clock signals relative to one another and the deviations from the ideal case, dedicated analysis circuitry can extract this information automatically in order to locate the origin of the fault. For example, if a deviation is caused by race conditions along two or more identified signal paths, proper delay elements or boosting elements can be activated under control of the analysis circuitry. If a stuck-at fault gives rise to a discrepancy in the pulse train, the analysis circuitry can automatically replace the faulty part by a spare part upon identifying the origin.

The invention also relates to a method of testing an electronic circuit that has a plurality of respective nodes at which a plurality of respective clock signals are present in operational use of the circuit. According to the invention, the method comprises the steps of enabling the occurrence of the clock signals at the nodes; logically combining the clock signals to create a pulse train; and using the pulse train to test a pre-determined timing relationship amongst the clock signals. The logic combining of the clock signals is preferably carried out by an on-chip logic circuit. The output of the logic circuit may be connected to a bonding pad that is provided for test purposes only. This bonding pad then is not connected to the lead frame.

BRIEF DESCRIPTION OF THE DRAWING

Various aspects of the invention are explained below in further detail and by way of example with reference to the accompanying drawing, wherein.

Throughout the drawing like reference symbols indicate corresponding or similar features.

DETAILED EMBODIMENTS

Figure 1:
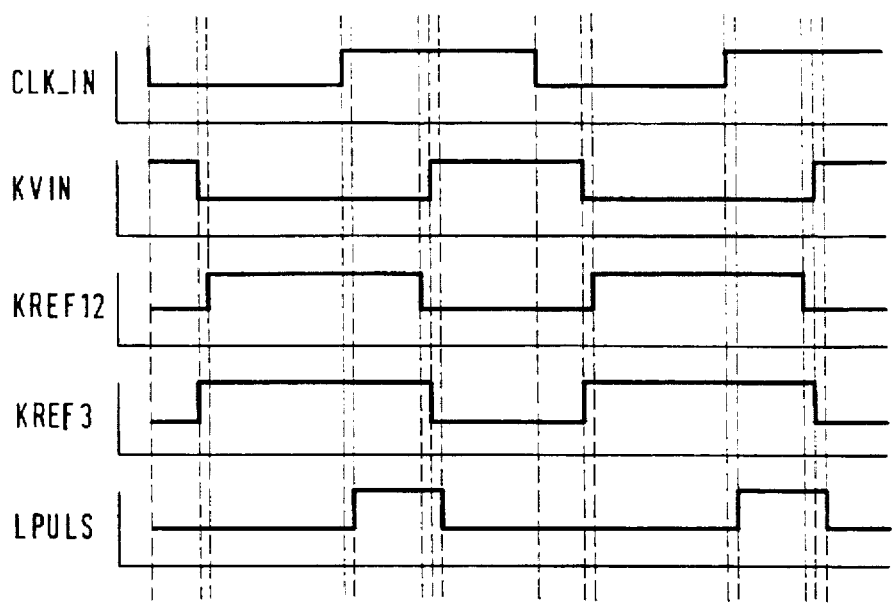
FIG. 1 is a diagram showing the temporal relationship among various signals.

FIG. 1 is a time diagram of a clock signal $CLK_{IN}$ and further signals KVIN, $KREF_{12}$, $KREF_3$ and LPULS, generated on the basis of $CLK_{IN}$. Two complete cycles are shown of these periodic signals. For the sake of completeness it is observed that these signals serve to control an A/D converter, for which reference is had to FIG. 4. These signals must comply with a pre-defined timing relationship in order to ensure a correct operation of the A/D converter.

Figure 2:
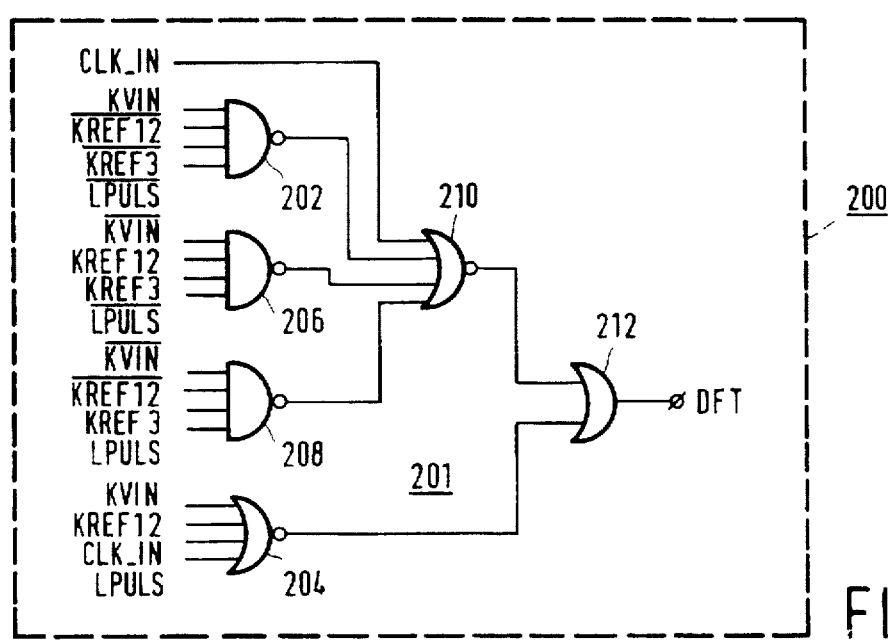
FIG. 2 is a diagram of a logic circuit to create a pulse train.

FIG. 2 is a diagram of an integrated circuit 200 provided with logic circuit 201 to test the integrity of the relationship among the signals of FIG. 1. Circuit 201 comprises a NAND gate 202, a NOR gate 204, a NAND gate 206, a NAND gate 208, a NOR gate 210 and an OR gate 212. Logic gates 202-208 receive various combinations of signals $CLK_{IN}$, KVIN, $KREF_{12}$, $KREF_3$ and LPULS, and their logic complements. These names are idiosyncratic for the envisaged target circuit, but the principle of various clock signals of specific shape and mutual shifting is a standard feature in the art of A/D and D/A conversion. Outputs of gates 202, 206 and 208 are connected to inputs of NOR gate 210. NOR gate 210 also receives $CLK_{IN}$. Outputs of NOR gates 204 and 210 are connected to inputs of OR gate 212. An output of OR gate 212 provides as a test signal a pulse train discussed with reference to FIG. 3.

Figure 3:
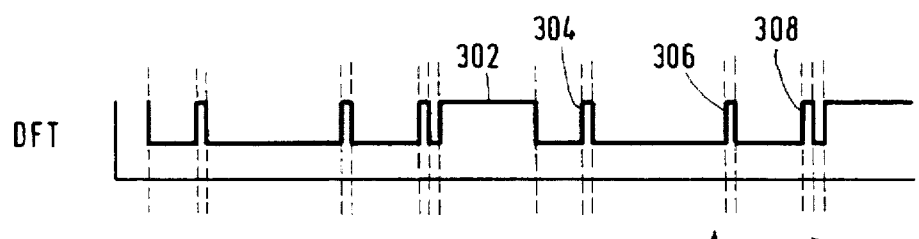
FIG. 3 is a diagram of the pulse train provided by the circuit of FIG. 2 when receiving the signals of FIG. 1 and its logic complements.

FIG. 3 shows a pulse train DFT formed by circuit 200. Pulse train DFT is periodic with the same period as that of signals $CLK_{IN}$, KVIN, $KREF_{12}$, $KREF_3$ and LPULS. Pulse train DFT is shown over a length of two complete cycles. Each cycle comprises a plurality of pulses 302, 304, 306 and 308. As is clear from FIGS. 1 and 2, pulse 302 stems from gate 202, pulse 304 originates in gate 204, pulse 306 is determined by gate 206 and pulse 308 derives from gate 208. If signals $CLK_{IN}$, KVIN, $KREF_{12}$, $KREF_3$ and LPULS comply with the desired timing relationship, the widths and positions of pulses 302-308 are known. Any fault causing timing errors or stuck-at behaviour will be detected by the change it brings about in the pulse train DFT.

Figure 4:
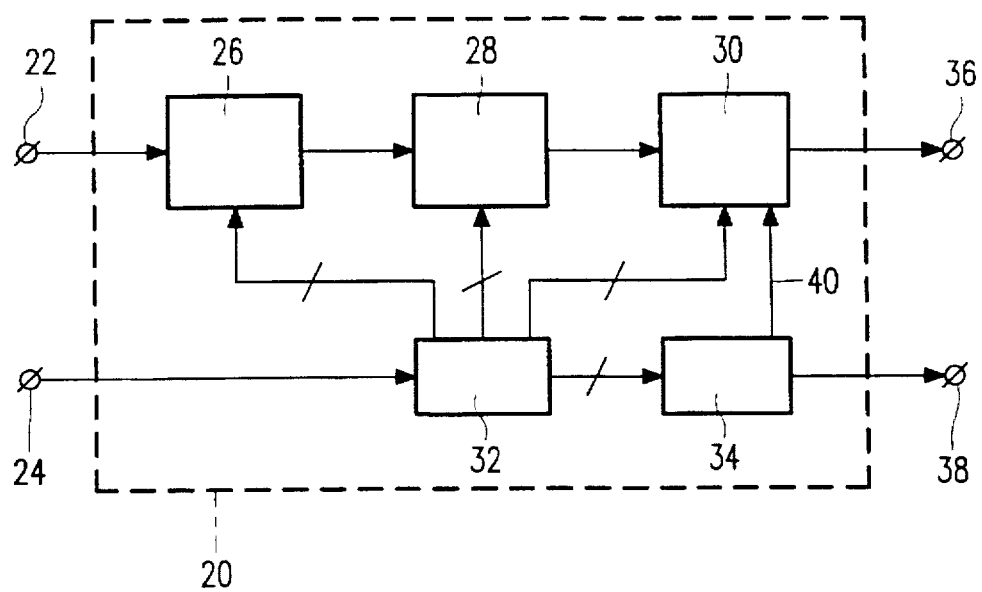
FIG. 4 is a diagram of a testable circuit that comprises both a D/A and an A/D conversion element.

FIG. 4 is a diagram of a testable circuit that comprises both a D/A and an A/D conversion element. An analog signal is received on input 22. Block 26 represents an analog to digital converter, such as disclosed for example in H. Reyhani et al, A 5V, 6-b, 80 Ms/s BiCMOS Flash ADC, IEEE Jour. of Solid State Circuits, Vol. 29, No. 8, August 1994, p.873-878, and in G. Ruan, A Behavioral Model of A/D Converters Using a Mixed-Mode Simulator, ditto, Vol. 26, No. 3, March 1991, p.283-290. FIG. 3 of the latter paper also includes a D2A (D/A) converter. The clocking facility in both cases has a plurality of mutually shifted clock signals.

In FIG. 4, the digital signal is processed in digital signal processor 28. The output result is fed to D/A converter 30 for presentation on output 36. Clocking facility 32 receives a master clock on input 24. Alternatively, the master clock may be generated internally. Facility 32 develops various secondary clock signals for presentation to elements 26, 28, 30, that may receive plural different clock signals in parallel as exemplified in earlier Figures of this application, and as symbolized here with respective crossed lines. In blocks 26, 28, 30, these clock signals will be applied to respective nodes. Moreover, these clock signals are selectively presented to test circuitry block 34 that may contain facilites of the broad category shown in FIG. 2. In this manner, the pulse developers thereof may be connected directly or indirectly to selective nodes of the elements 26, 28, 30. The eventual pulse train so developed may be presented on output 38 for further evaluation. Alternatively, the evaluation may be executed in parts of the internal functional circuitry that are reserved therefor, or shared with other functions.

We claim:

1. A large scale integrated electronic circuit, comprising:
   digital circuitry elements and multiple clocked nodes interconnected to said circuitry elements for on said nodes receiving various different clock signals having a common overall clock period;
   internal test circuitry for testing a plurality of timing relationships between subsets of said clock signals, said internal test circuitry including, for each such subset, a respective logic function generating means fed by said nodes for, exclusively conditionally to a predetermined timing relationship among the subset in question, producing a predetermined logic pulse; and
   amalgamating circuitry fed by said logic function generating means for producing, exclusively conditionally to the predetermined timing relationships among all subsets so combined, a predetermined periodic logic pulse train.

2. A circuit as claimed in claim 1, and furthermore comprising D/A and/or A/D circuitry, that is clocked by said clock signals and and comprises at least part of said nodes for testing.

3. An electronic circuit with a plurality of respective nodes at which a plurality of respective clock signals are present in operational use of the circuit, characterized in that: the circuit includes logic circuitry having inputs connected to the nodes and having an output to provide a pulse train for testing a predetermined timing relationship amongst the clock signals, said logic circuitry including a plurality of subsets of logic gates, each subset receiving an associated subset of the clock signals and outputting a logic signal in response to a predetermined relationship existing between the clock signals of the subset of clock signals, and said pulse train comprising the logic signals output by said subsets of logic gates.

4. A method for testing a large scale integrated electronic circuit having digital circuitry elements and multiple clocked nodes interconnected to said circuitry elements, said method comprising:

(a) providing internal logic circuitry in the electronic circuitry for generating logic functions for various associated subsets of the clock signals;

(b) providing internal amalgamating circuitry fed by said internal logic circuitry;

testing a plurality of timing relationships between the subsets of said nodes that receive respective clock signals with the internal test circuitry to generate logic functions for various associated said subsets, exclusively conditionally to a predetermined timing relationship among the clock signals of the subset in question; and producing a predetermined logic pulse, and feeding various such logic pulses to the amalgamating circuitry, for in said amalgamating circuitry producing, exclusively conditionally to the predetermined timing relationships among all subsets so combined, a predetermined periodic logic pulse train.

5. A method of claimed in claim 4, for use with a circuit comprising D/A and/or A/D circuitry, that is clocked by said clock signals and and comprises at least part of said nodes for testing.

6. A method of testing an electronic circuit that has a plurality of respective nodes at which a plurality of respective clock signals are present in operational use of the circuit, characterized in that the method comprises:

enabling the occurrence of the clock signals at the nodes;

dividing the clock signals into subsets of clock signals;

logically testing each subset of clock signals with logic gates for the existence of a predetermined relationship between the clock signals of said each subset and outputting a logic signal indicative of said predetermined relationship being met;

logically combining the logic signals from the test of each subset to create a pulse train;

using the pulse train to test a pre-determined timing relationship amongst the clock signals.

* * * * *